United States Patent
Lee

(10) Patent No.: US 7,504,656 B2
(45) Date of Patent: Mar. 17, 2009

(54) ORGANIC LIGHT EMITTING DISPLAY DEVICE AND METHOD OF FABRICATING THE SAME

(75) Inventor: Kwan-Hee Lee, Seoul (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 187 days.

(21) Appl. No.: 11/135,346

(22) Filed: May 24, 2005

(65) Prior Publication Data

US 2005/0263757 A1 Dec. 1, 2005

(30) Foreign Application Priority Data

May 25, 2004 (KR) .................... 10-2004-0037555

(51) Int. Cl.
*H01L 21/00* (2006.01)

(52) U.S. Cl. .............................. 257/40; 257/98; 257/59

(58) Field of Classification Search ......... 257/E33.044, 257/E33.06, E33.067, E33.07, 40, 59, 98
See application file for complete search history.

(56) References Cited

U.S. PATENT DOCUMENTS

| | | | |
|---|---|---|---|
| 5,742,129 | A | 4/1998 | Nagayama et al. |
| 6,281,626 | B1 * | 8/2001 | Nakamura et al. ........... 313/491 |
| 7,187,001 | B2 * | 3/2007 | Kim et al. ...................... 257/40 |
| 7,227,306 | B2 * | 6/2007 | Park et al. .................... 313/506 |
| 7,233,020 | B2 * | 6/2007 | Park et al. ...................... 257/40 |
| 7,371,502 | B2 * | 5/2008 | Song et al. .................. 430/199 |
| 7,402,950 | B2 * | 7/2008 | Park et al. .................... 313/506 |
| 7,408,192 | B2 * | 8/2008 | Kang ............................ 257/59 |
| 7,420,212 | B2 * | 9/2008 | Kim et al. ...................... 257/72 |
| 2002/0093286 | A1 | 7/2002 | Ohshita et al. |
| 2002/0187265 | A1 | 12/2002 | Mori et al. |
| 2003/0189400 | A1 * | 10/2003 | Nishio et al. ................. 313/504 |
| 2003/0201708 | A1 * | 10/2003 | Yamada et al. .............. 313/495 |
| 2004/0217695 | A1 * | 11/2004 | Yoneda et al. .............. 313/504 |
| 2005/0001546 | A1 * | 1/2005 | Yamaguchi .................. 313/512 |
| 2005/0046342 | A1 * | 3/2005 | Park et al. .................... 313/504 |
| 2005/0110028 | A1 * | 5/2005 | Park et al. ...................... 257/88 |
| 2005/0110398 | A1 * | 5/2005 | Lee ............................ 313/504 |

(Continued)

FOREIGN PATENT DOCUMENTS

CN             1481201        3/2004

(Continued)

OTHER PUBLICATIONS

European Search Report.

(Continued)

*Primary Examiner*—Laura M Menz
(74) *Attorney, Agent, or Firm*—H.C. Park & Associates, PLC

(57) ABSTRACT

An organic light emitting display (OLED) device and method of fabricating the same are disclosed. The device may include unit pixel regions arranged on a substrate. Each of the unit pixel regions may include an emission region and a non-emission region. A pixel electrode may be disposed at least in the emission region. A pillar may be disposed between emission regions of adjacent unit pixel regions that emit same-colored light. The pillar may protrude upward further than the pixel electrode. An emission layer may be disposed on the pixel electrode. An opposite electrode may be disposed on the emission layer.

13 Claims, 20 Drawing Sheets

U.S. PATENT DOCUMENTS

| | | | |
|---|---|---|---|
| 2005/0116905 A1* | 6/2005 | Kim et al. | 345/76 |
| 2005/0230684 A1* | 10/2005 | Seo et al. | 257/72 |
| 2005/0263757 A1* | 12/2005 | Lee | 257/40 |
| 2005/0285100 A1* | 12/2005 | Jeong et al. | 257/40 |
| 2006/0049753 A1* | 3/2006 | Kang et al. | 313/506 |
| 2006/0082292 A1* | 4/2006 | Kang et al. | 313/504 |
| 2006/0124933 A1* | 6/2006 | Kang | 257/59 |
| 2006/0125381 A1* | 6/2006 | Oh | 313/504 |
| 2007/0021025 A1* | 1/2007 | Kim et al. | 445/24 |
| 2007/0045620 A1* | 3/2007 | Park et al. | 257/40 |
| 2007/0046186 A1* | 3/2007 | Kim | 313/504 |
| 2007/0090757 A1* | 4/2007 | Kim et al. | 313/506 |
| 2007/0096613 A1* | 5/2007 | Shin et al. | 313/112 |
| 2008/0121886 A1* | 5/2008 | Shin | 257/59 |
| 2008/0128686 A1* | 6/2008 | Kwon | 257/40 |
| 2008/0180024 A1* | 7/2008 | Kwon | 313/504 |
| 2008/0218058 A1* | 9/2008 | Son | 313/500 |
| 2008/0218066 A1* | 9/2008 | Kim | 313/504 |

FOREIGN PATENT DOCUMENTS

| | | |
|---|---|---|
| EP | 1 102 317 A | 5/2001 |
| JP | 08-227276 | 9/1996 |
| JP | 2001-148291 | 5/2001 |
| JP | 2001-291583 | 10/2001 |
| JP | 2002-151255 | 5/2002 |
| JP | 2002-208484 | 7/2002 |
| JP | 2003-347048 | 12/2003 |
| KR | 1020010097319 | 11/2001 |
| KR | 10-2002-0061114 | 7/2002 |
| KR | 10-2002-0088927 | 11/2002 |
| KR | 10-2003-0025815 | 3/2003 |

OTHER PUBLICATIONS

Chinese Office Action dated Mar. 7, 2008.

* cited by examiner

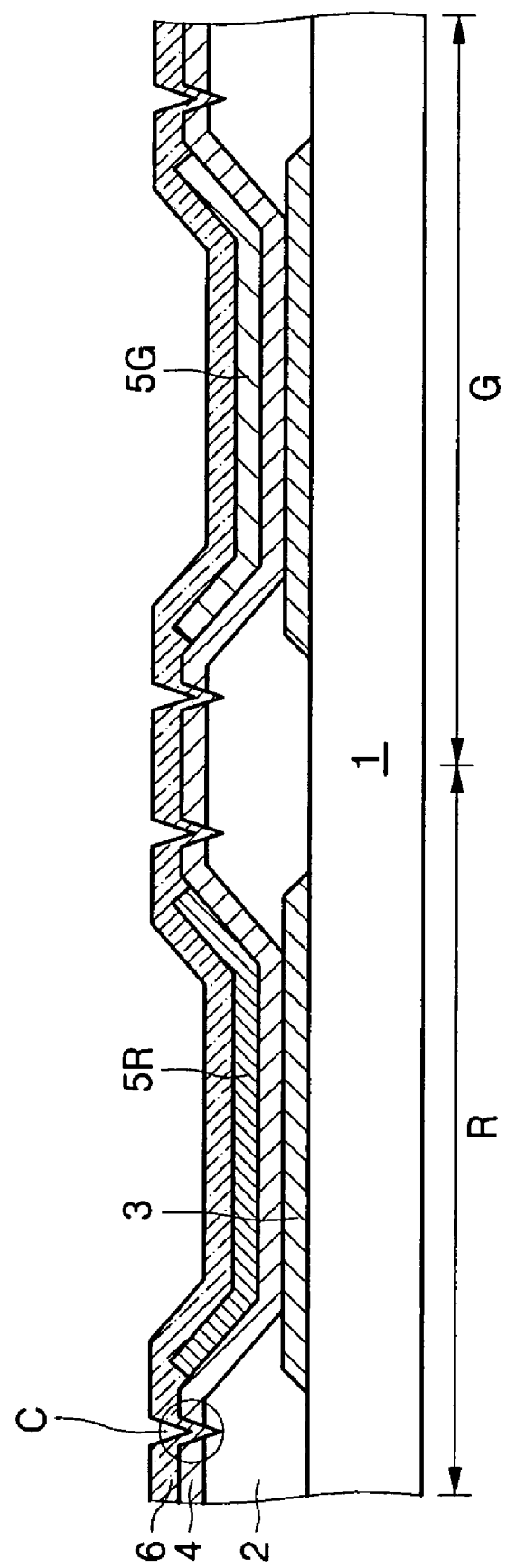

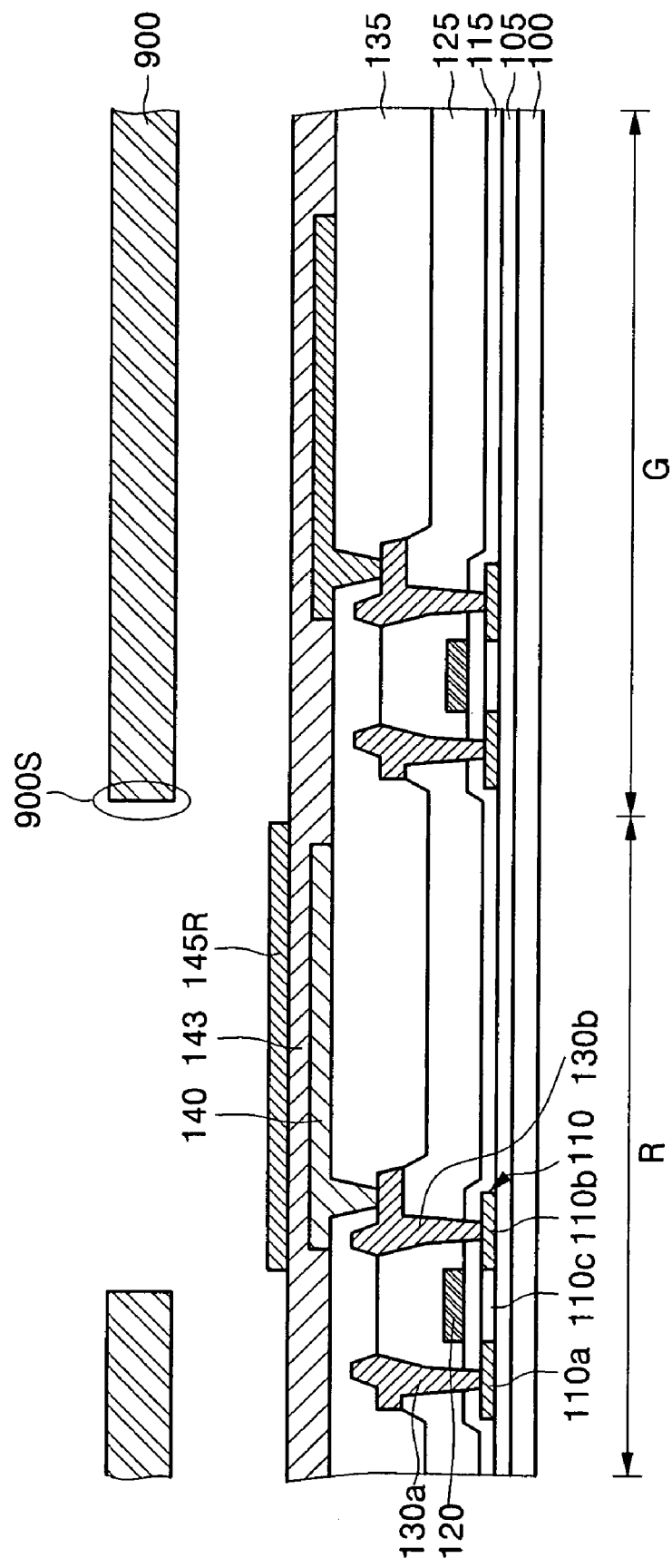

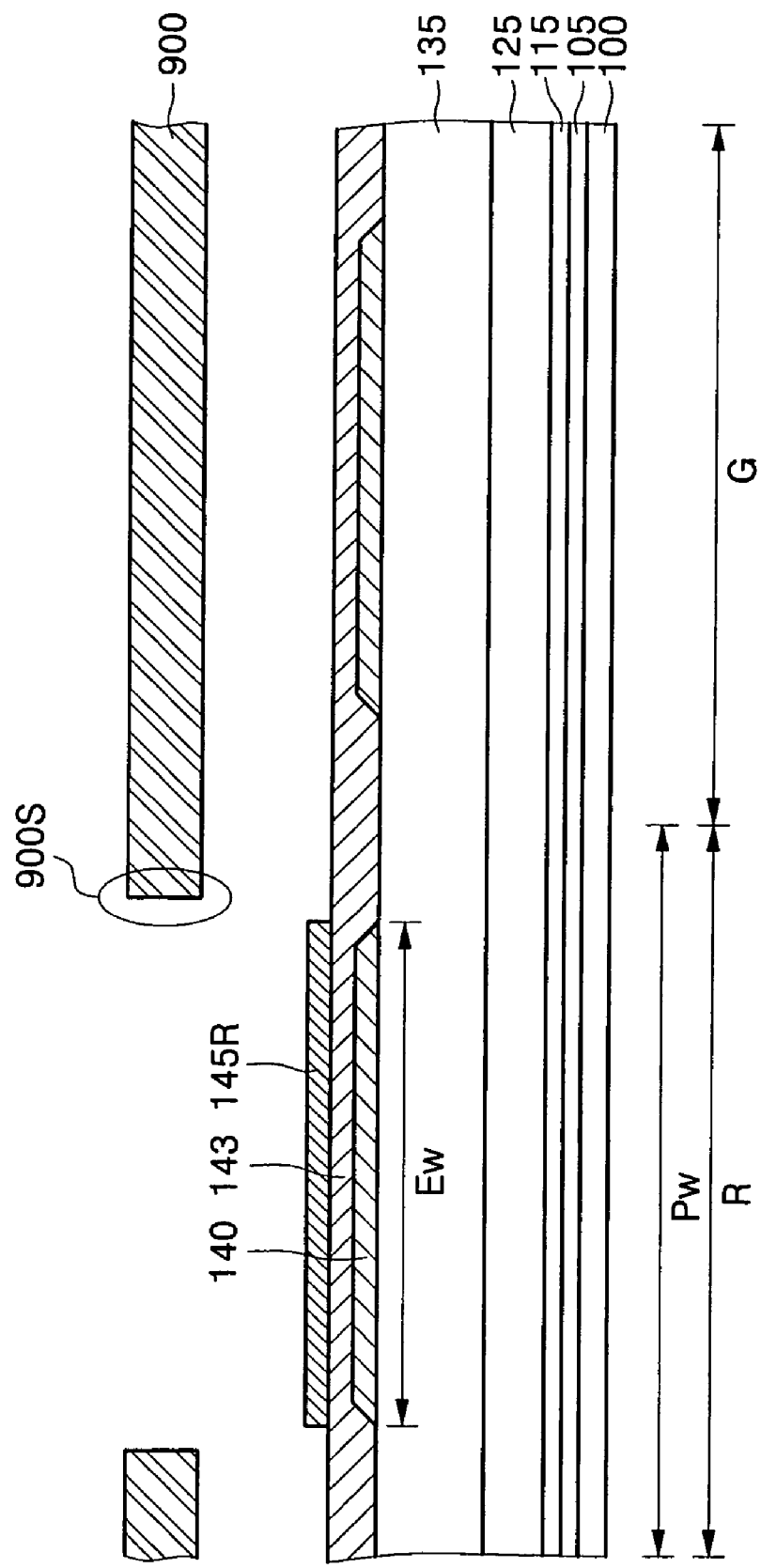

ORGANIC LIGHT EMITTING DISPLAY DEVICE AND METHOD OF FABRICATING THE SAME

CROSS-REFERENCE TO RELATED APPLICATION

This application claims priority to Korean Patent Application No. 2004-37555, filed May 25, 2004, the disclosure of which is herein incorporated by reference in its entirety.

BACKGROUND OF THE INVENTION

1. Field of the Invention

The present invention relates to flat panel displays (FPDs) generally and, more particularly, to an organic light emitting display (OLED) device and method of fabricating the same.

2. Description of the Related Art

Flat panel displays (FPDs) incorporating light emitting diodes (LEDs) have garnered much attention as replacements for conventional cathode ray tube (CRT) displays. An LED is an electronic device fabricated by positioning a series of thin films between two conductors. The thin films emit bright light when current is applied to the conductors. Even with multiple layers, LEDs are very thin and can be used to produce thin FPDs that are self-luminous, e.g., do not require backlighting. If the thin films sandwiched between the conductors are formed of organic materials, a flat panel organic electroluminescent display (OLED) device may be produced. Such OLED devices have wider viewing angles, faster video response speeds, and lower power consumption than CRT displays. Other advantages of OLED devices over CRT displays include increased brightness, lighter weight, improved durability, and expanded ranges of operating temperatures.

FIG. 1A and FIG. 1B are plan views illustrating a method of fabricating a conventional OLED device, and FIG. 2A and FIG. 2B are cross-sectional views taken along lines I-I of FIG. 1A and FIG. 1B, respectively.

Referring to FIG. 1A and FIG. 2A, anodes 3 are formed on an insulating substrate 1 including red (R), green (G), and blue (B) unit pixel regions R, G, and B. Each of the anodes 3 is located in one of the unit pixel regions R, G, and B. A pixel defining layer 2 is formed on the anode 3 such that it has an opening 2a exposing a portion of the surface of the anode 3. The opening 2a defines an emission region E. A hole injection/transport layer 4 is formed on the entire surface of the substrate 1 having the opening 2a.

Thereafter, a fine metal mask 9 is located on the substrate 1 where the hole injection/transport layer 4 is formed such that the mask has a slit exposing the red unit pixel region R. The fine metal mask 9 is adhered to the substrate 1 using a vacuum absorption process. Then, a red emission layer 5R is deposited using the fine metal mask 9 as a mask. Thus, the red emission layer 5R is formed on the hole injection/transport layer 4 in the red unit pixel region R.

Referring to FIG. 1B and FIG. 2B, after the red emission layer 5R is formed, the fine metal mask 9 is removed. During this process, a crack C may form in a portion (S of FIG. 2A) of the hole injection/transport layer 4, which adheres to an edge of the slit of the fine metal mask 9. Generally, the edge of the slit of the fine metal mask 9 is rough, and this rough edge may make the crack C worse. The crack C may also form in the underlying pixel defining layer 2 through the hole injection/transport layer 4. Also, when the hole injection/transport layer 4 is not formed, the crack C may form directly in the pixel defining layer 2.

After the fine metal mask 9 is removed, a green emission layer 5G and a blue emission layer 5B are formed on the green and blue unit pixel regions G and B, respectively, in the same manner as when the red emission layer 5R is formed. Likewise, cracks may be formed in the hole injection/transport layer 4 or the pixel defining layer 2 on both sides of each of the green and blue emission layers 5G and 5B.

Subsequently, a cathode 6 is formed on the emission layers 5R, 5G, and 5B. However, if a crack C was formed, it may thin or sever the portion of the cathode 6 that overlays the crack C. In either case, the cathode 6 is weakened. The weakened cathode regions may result in some disadvantages, such as a unit pixel reduction phenomenon that reduces the amount of light emitted from an edge portion of a unit pixel during the operation of the OLED device.

SUMMARY OF THE INVENTION

The present invention may solve the aforementioned problems and/or overcome the disadvantages associated with manufacturing and/or operating conventional OLED devices by providing an OLED device and method of fabricating the same that suppress and/or eliminate the unit pixel reduction phenomenon.

The present invention discloses an OLED device including unit pixel regions arranged on a substrate. Each of the unit pixel regions may include an emission region and a non-emission region. A pixel electrode may be disposed at least in the emission region. A pillar may be disposed between emission regions of adjacent unit pixel regions that emit a same-colored light. The pillar may protrude upward further than the pixel electrode. An emission layer may be disposed on the pixel electrode, and an opposite electrode may be disposed on the emission layer.

The present invention also discloses an OLED device including unit pixel regions arranged on a substrate, each of the unit pixel regions including an emission region and a non-emission region. A pixel electrode may be disposed at least in the emission region. A pillar may protrude upward further than the pixel electrode. The pillar may have a length equal to or smaller than a distance between emission regions of adjacent unit pixel regions that emit same-colored light that emit the same colored light. The pillar may have a width smaller than that of each of the unit pixel regions. An emission layer may be disposed on the pixel electrode. An opposite electrode may be disposed on the emission layer.

The present invention also discloses a method of fabricating an OLED device including the following, which may be performed in any suitable order. Forming a pixel electrode on a substrate in an emission region of a unit pixel region, the unit pixel region also including a non-emission region. Forming a pillar between emission regions of adjacent unit pixel regions that emit the same-colored light. Adhering a fine metal mask to the substrate having the pillar, the fine metal mask having a slit that exposes the adjacent unit pixel regions that emit the same-colored light. Additionally, the method may include forming an emission layer on the exposed unit pixel regions.

BRIEF DESCRIPTION OF THE DRAWINGS

The above and other features of the present invention will be described in reference to certain embodiments thereof with reference to the attached drawings.

FIG. 2A and FIG. 2B are cross-sectional views taken along lines I-I of FIG. 1A and FIG. 1B, respectively.

FIG. 8A and FIG. 8B are cross-sectional views taken along lines II-II of FIG. 3A and FIG. 3B, respectively, which illustrate a second method of fabricating an OLED device of the present invention.

FIG. 9A and FIG. 9B are cross-sectional views taken along lines III-III of FIG. 3A and FIG. 3B, respectively, which further illustrate the method according to another embodiment of the present invention.

DETAILED DESCRIPTION

Figure 1A:
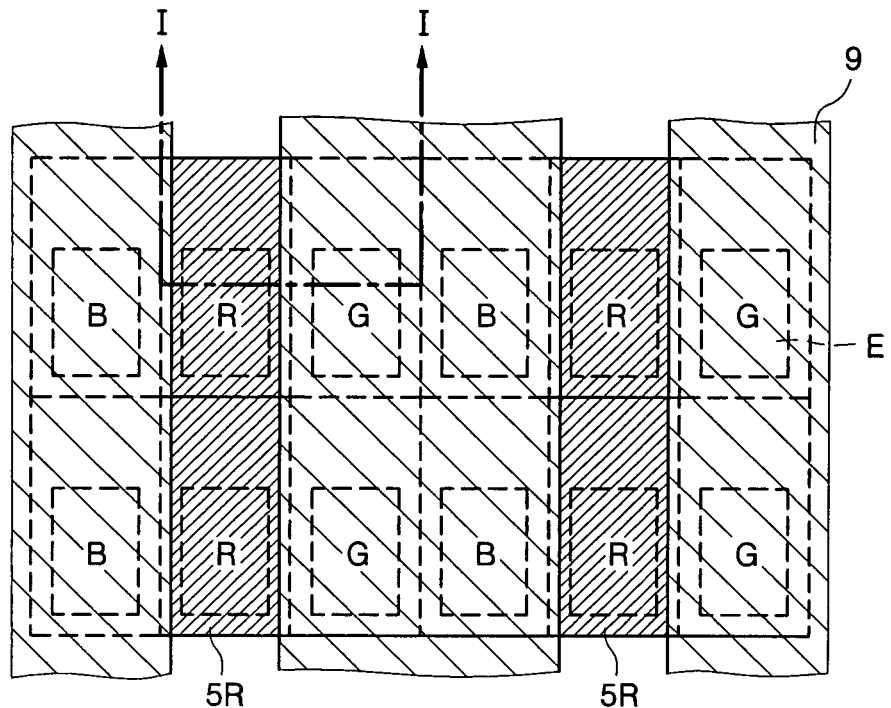
FIG. 1A and FIG. 1B are plan views illustrating a method of fabricating a conventional organic light emitting display device (OLED).
Figure 1B:
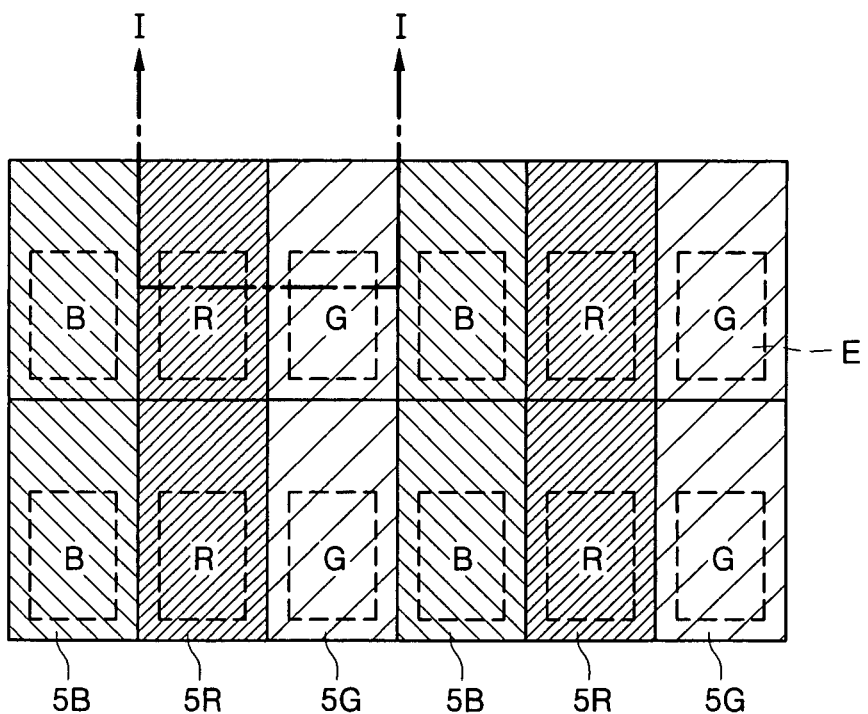
Figure 2A:
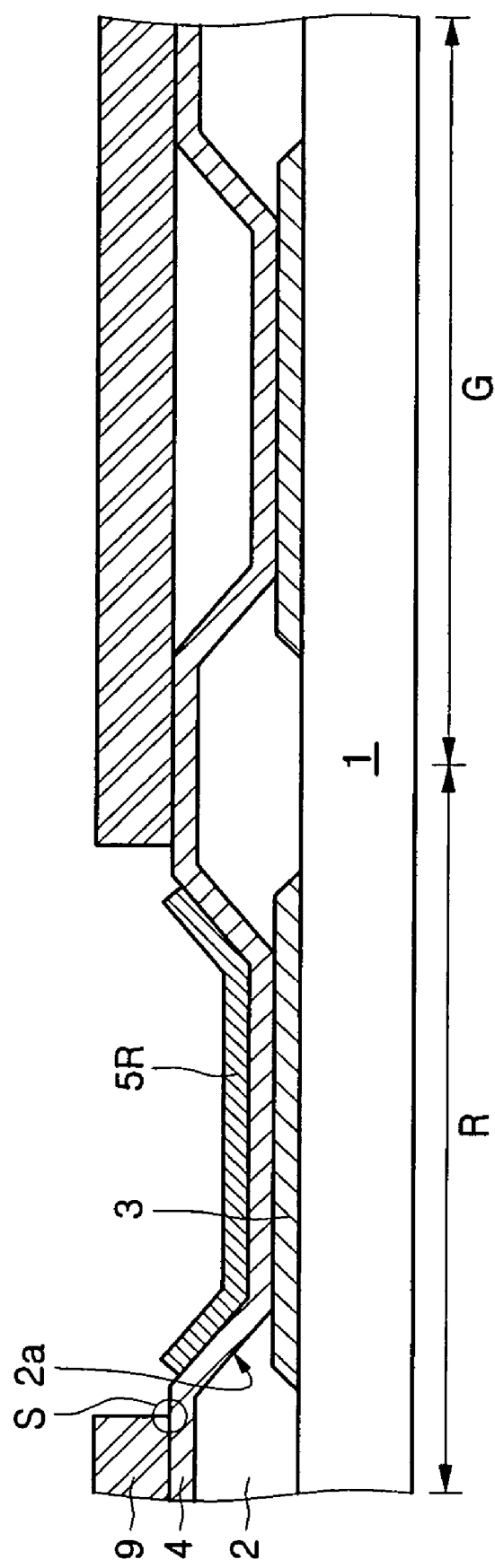

The present invention is described more fully hereinafter with reference to the accompanying drawings, in which embodiments of the invention are shown. The invention may, however, be embodied in different forms and should not be construed as limited to the embodiments set forth herein. Rather, these embodiments are provided so that the disclosure is thorough and complete and fully conveys the scope of the invention to those skilled in the art. The thicknesses of layers or regions shown in the drawings may be exaggerated for clarity, and the same reference numerals may be used to denote the same elements throughout the specification.

Figure 3A:
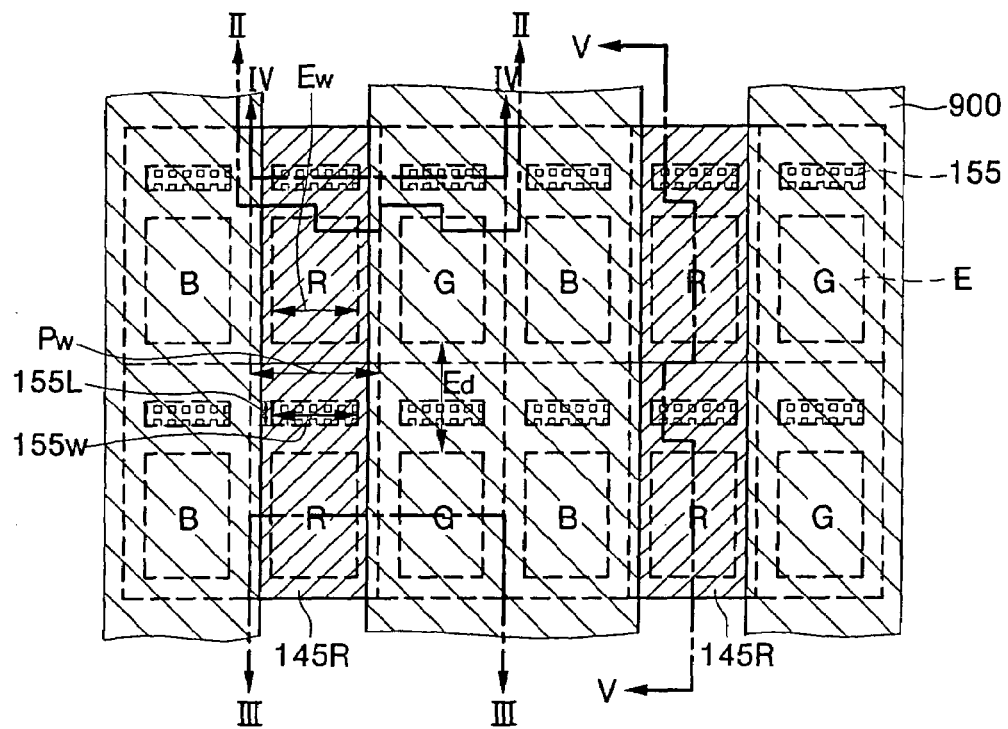
FIG. 3A and FIG. 3B are plan views illustrating a first method of fabricating an OLED device according to embodiments of the present invention.
Figure 3B:
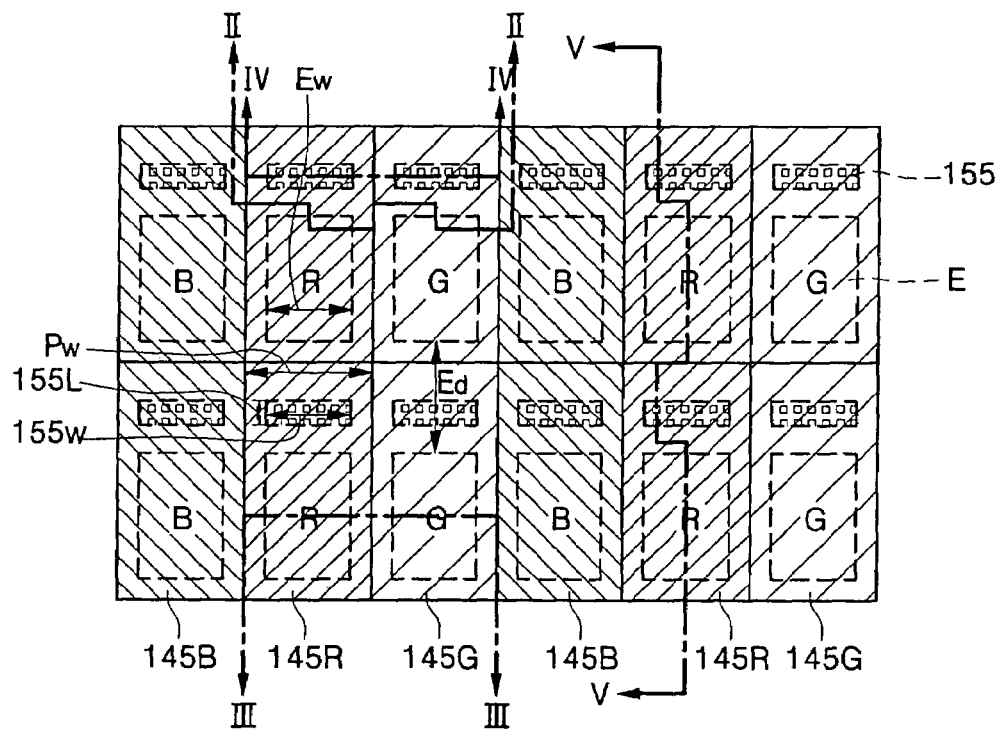
Figure 4A:
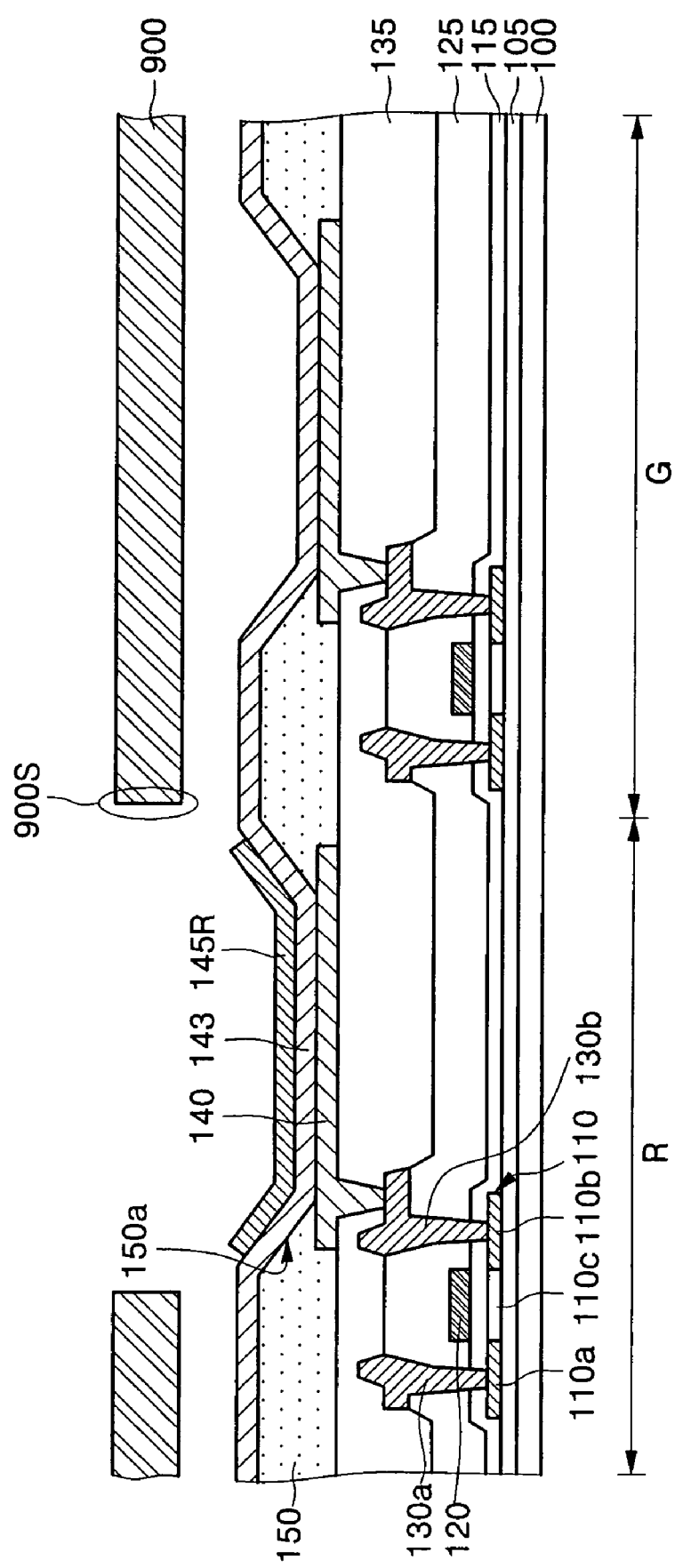
FIG. 4A and FIG. 4B are cross-sectional views taken along lines II-II of FIG. 3A and FIG. 3B, respectively, which further illustrate the first method of fabricating an OLED device of the present invention.
Figure 4B:
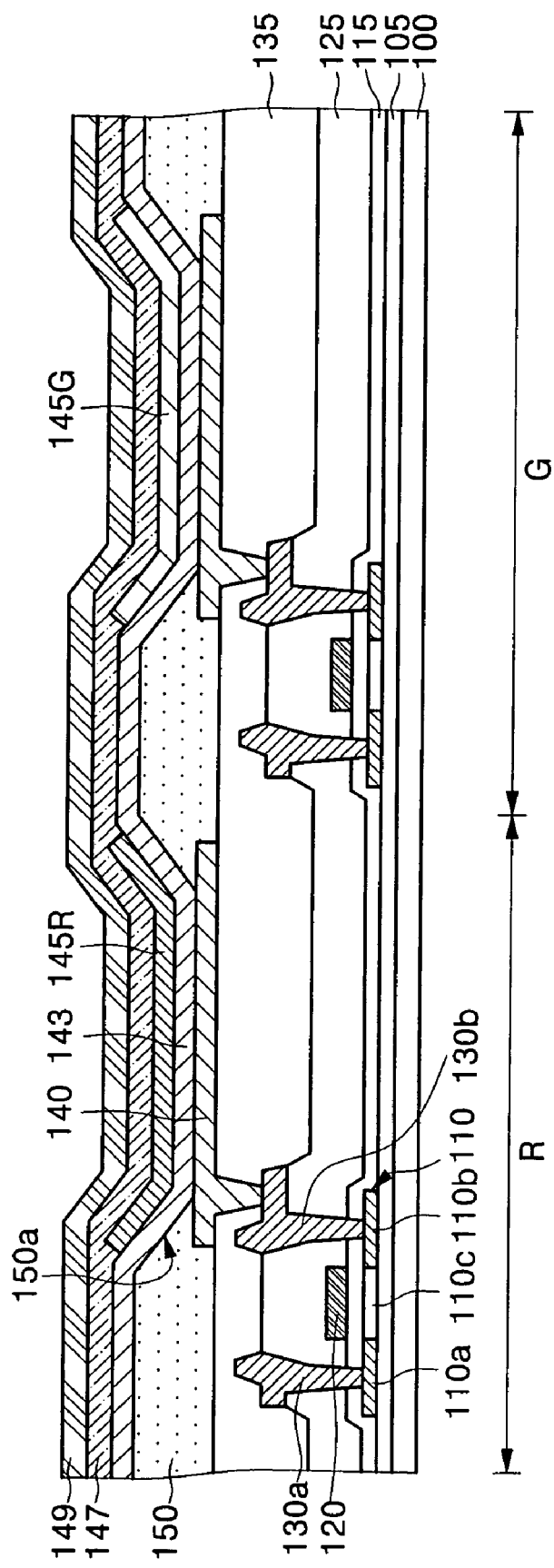
Figure 5A:
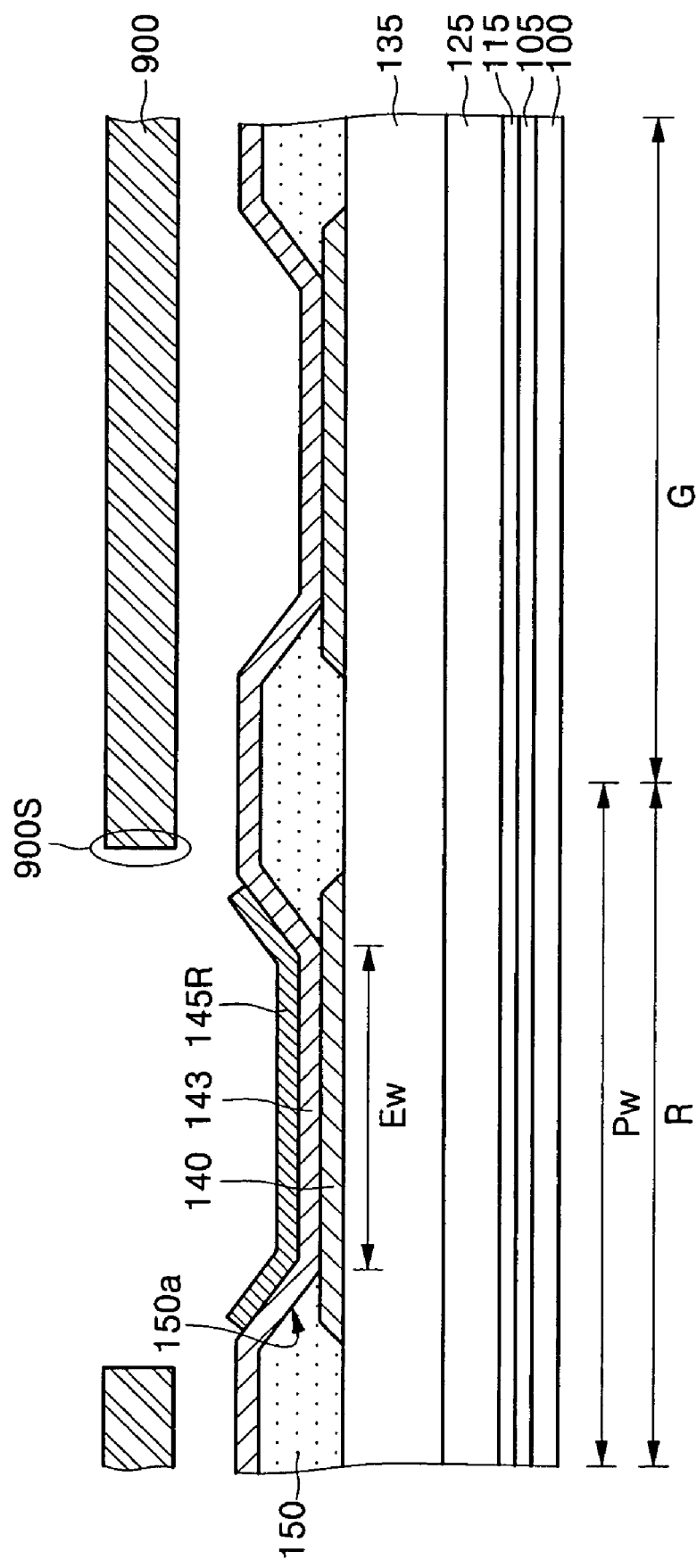
FIG. 5A and FIG. 5B are cross-sectional views taken along lines III-III of FIG. 3A and FIG. 3B, respectively, which further illustrate the first method of fabricating an OLED device of the present invention.
Figure 5B:
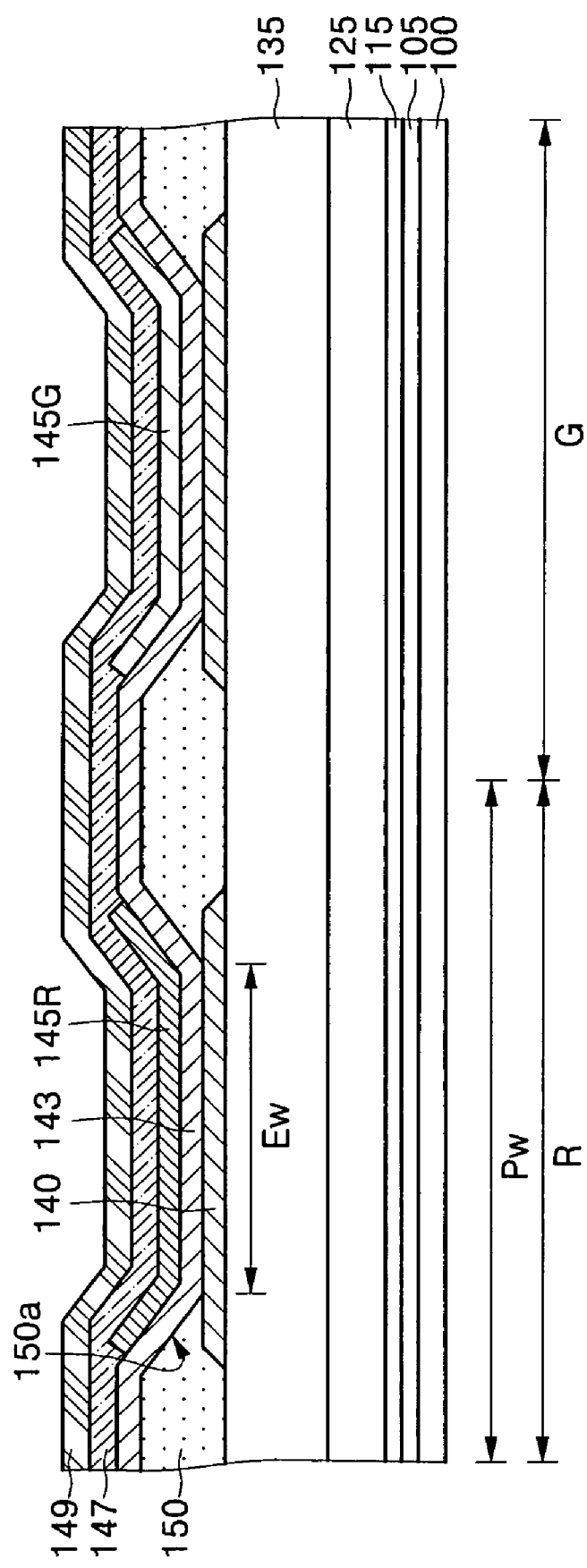
Figure 6A:
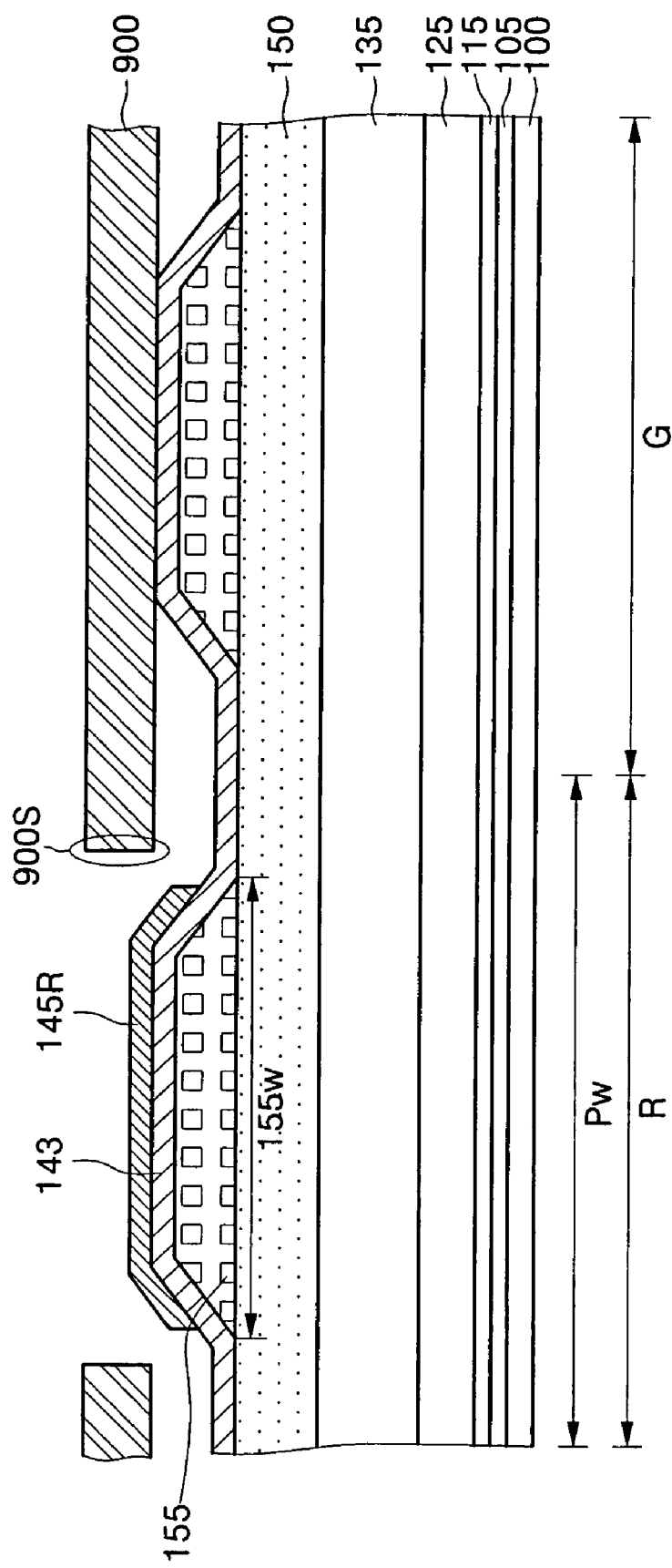
FIG. 6A and FIG. 6B are cross-sectional views taken along lines IV-IV of FIG. 3A and FIG. 3B, respectively, which further illustrate the first method of fabricating an OLED device of the present invention.
Figure 6B:
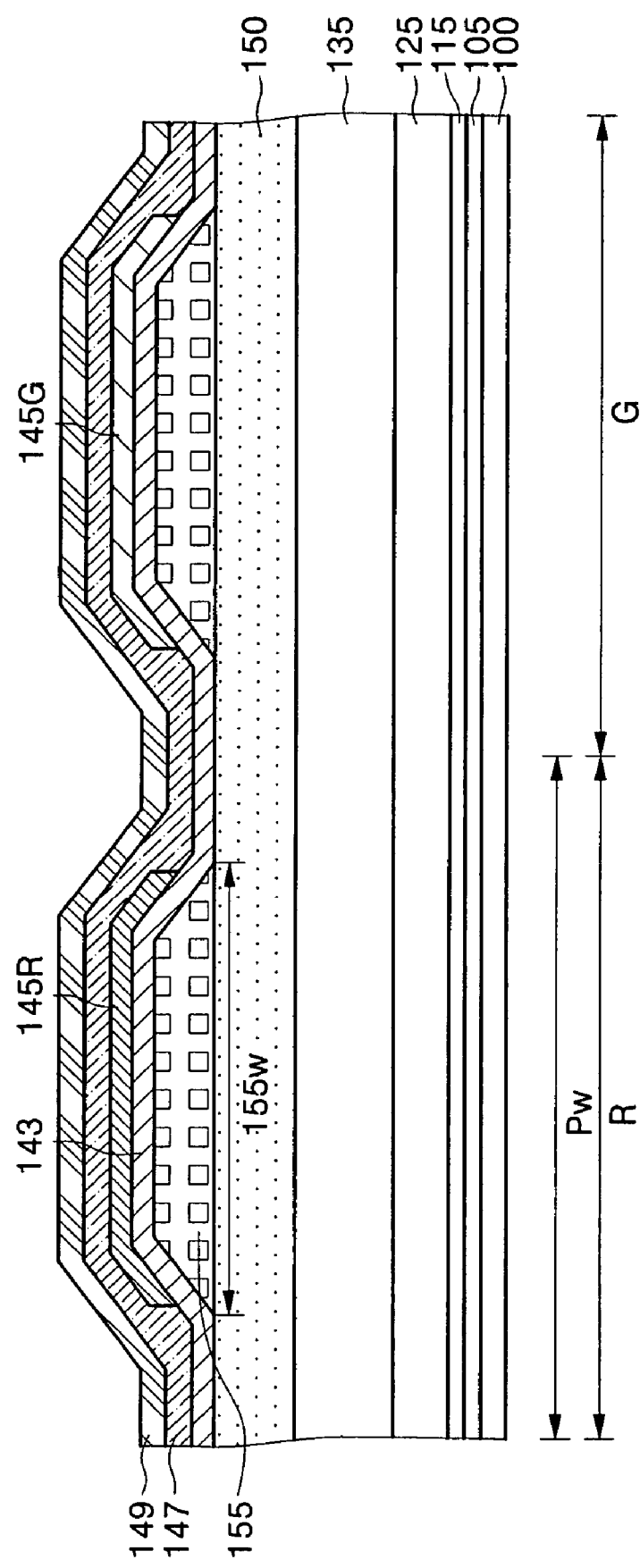
Figure 7A:
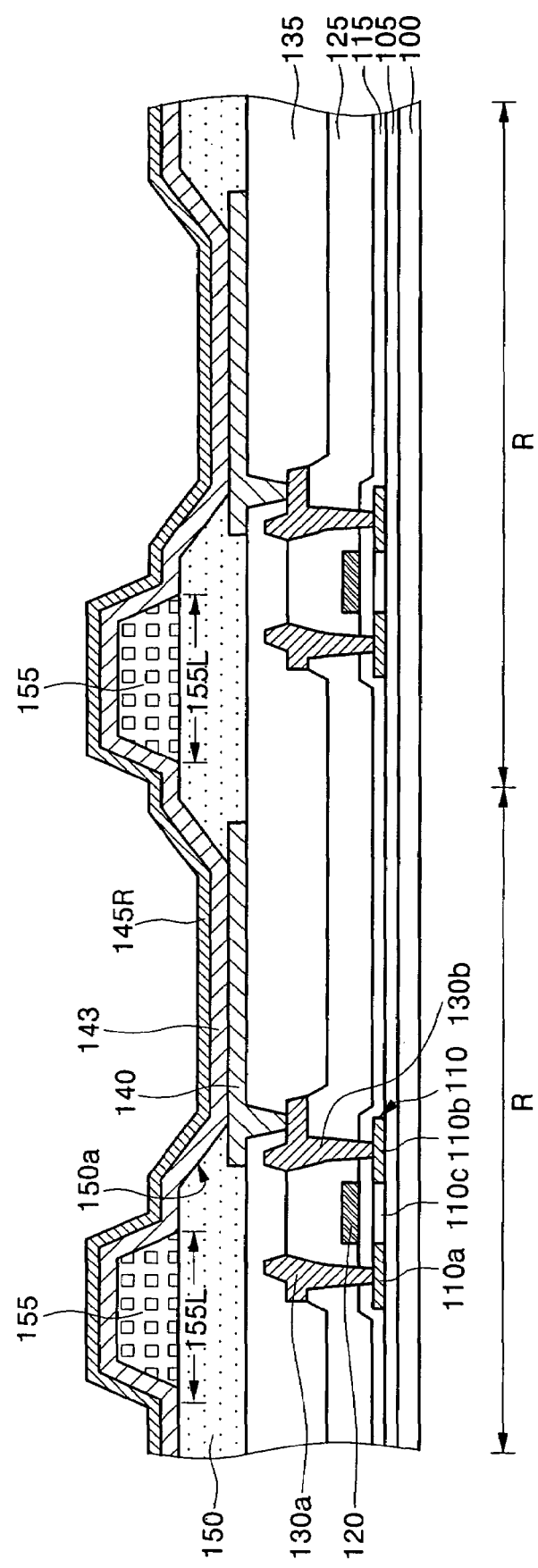
FIG. 7A and FIG. 7B are cross-sectional views taken along lines V-V of FIG. 3A and FIG. 3B, respectively, which further illustrate the first method of fabricating an OLED device of the present invention.
Figure 7B:
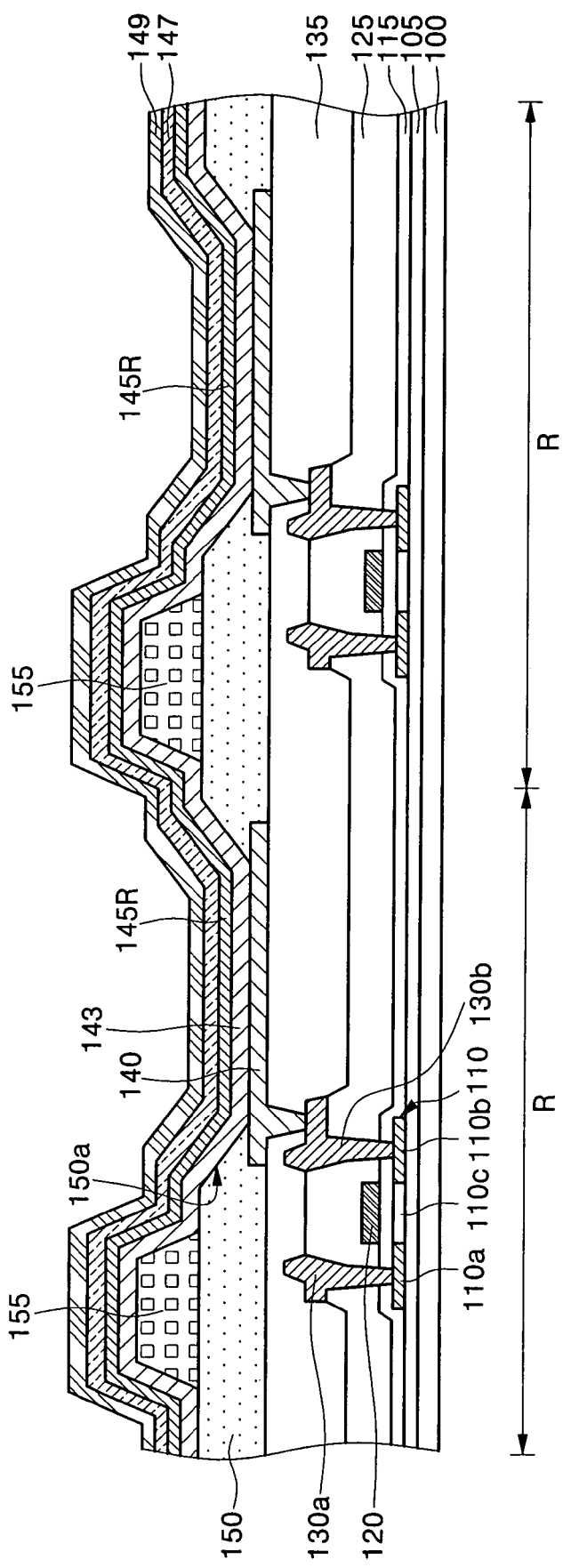

A first method of fabricating an organic light emitting display (OLED) according to an embodiment of the present invention is now described with reference to FIG. 3A, FIG. 3B, FIG. 4A, FIG. 4B, FIG. 5A, FIG. 5B, FIG. 6A, FIG. 6B, FIG. 7A and FIG. 7B. Specifically, FIG. 3A and FIG. 3B are plan views illustrating a method of fabricating an OLED device manufactured in accordance with the principles of the present invention. FIG. 4A and FIG. 4B are cross-sectional views taken along lines II-II of FIG. 3A and FIG. 3B, respectively. FIG. 5A and FIG. 5B are cross-sectional views taken along lines III-III of FIG. 3A and FIG. 3B, respectively. FIG. 6A and FIG. 6B are cross-sectional views taken along lines IV-IV of FIG. 3A and FIG. 3B, respectively. FIG. 7A and FIG. 7B are cross-sectional views taken along lines V-V of FIG. 3A and FIG. 3B, respectively.

Referring to FIG. 3A, FIG. 4A, FIG. 5A, FIG. 6A, and FIG. 7A, a substrate 100 on which red (R), green (G), and blue (B) unit pixel regions R, G, and B are arranged is provided. The unit pixel regions R, G, and B may be arranged in a stripe shape. That is, regions that emit same-colored light may be arranged in a column or row. Each of the unit pixel regions R, G, and B includes an emission region E and a non-emission region, which corresponds to a region excluding the emission region E.

The substrate 100 may be a glass substrate, a plastic substrate, or a quartz substrate. A buffer layer 105 may be formed on the substrate 100. A semiconductor layer 110 is formed on the buffer layer 105 in the non-emission region. The semiconductor layer 110 may be formed of amorphous silicon (a-Si) or poly crystalline silicon (poly-Si). Preferably, the semiconductor layer 110 is formed of poly-Si. The poly-Si semiconductor layer 110 can be obtained by forming a-Si on the substrate 100 and crystallizing the same. The crystallization of the a-Si may be performed using a metal induced crystallization (MIC) process, a metal induced lateral crystallization (MILC) process, an excimer laser annealing (ELA) process, or a sequential lateral solidification (SLS) process.

A gate insulating layer 115 may be formed on the semiconductor layer 110, and a gate electrode 120 may be formed on the gate insulating layer 115. Impurity ions may be doped into the semiconductor layer 110 using the gate electrode 120 as a mask, thereby forming source and drain regions 110a and 110b in the semiconductor layer 110. A channel region 110c may be defined between the source region 110a and drain region 110b. An interlayer insulating layer 125 may be formed on the gate electrode 120. A source electrode 130a and drain electrode 130b may be formed on the interlayer insulating layer 125. The source electrode 130a may contact the source region 110a through a first contact hole. The drain electrode 130 may contact the drain region 110b through a second contact hole. In this manner, a thin film transistor (TFT) including the semiconductor layer 110, the gate insulating layer 115, the gate electrode 120, and the source and drain electrodes 130a and 130b may be formed. During the formation of the TFT, a capacitor (not shown) may be formed in the non-emission region.

A passivation insulating layer 135 may be formed on the source and drain electrodes 130a and 130b. The passivation insulating layer 135 may be an organic layer, an inorganic layer, or a combination thereof. A pixel electrode 140 may be formed on the passivation insulating layer 135 to contact either the source electrode 130a or the drain electrode 130b through a via hole. The pixel electrode 140 may be formed as an anode or a cathode. When the pixel electrode 140 is formed as the anode, it may be made of indium tin oxide (ITO) or indium zinc oxide (IZO). Before the pixel electrode 140 as the anode is formed, a reflective layer may be formed on the passivation insulating layer 135 using one selected from the group consisting of Al, Ag, MoW, AlNd, and Ti. On the other hand, when the pixel electrode 140 is formed as the cathode, it may be made of Mg, Ca, Al, Ag, Ba, or an alloy thereof.

A pixel defining layer 150 may be formed on the pixel electrode 140 such that it has an opening 150a exposing a portion of the surface of the pixel electrode 140. A region occupied by the opening 150a corresponds to the emission region E. That is, in one embodiment, the emission region E is defined by the opening 150a, and the pixel electrode 140 is located at least in the emission region E. Meanwhile, a pixel driving circuit, which is electrically connected to the pixel electrode 140, may be disposed in the non-emission region. The pixel driving circuit may include the above-described TFT and capacitor.

The pixel defining layer 150 may be formed of an organic or inorganic layer. When the pixel defining layer 150 is formed of an organic layer, it may be formed of one selected from the group consisting of benzocyclobutene (BCB), acrylic photoresist, phenolic photoresist, and polyimide photoresist. However, the present invention is not limited to the materials or configurations described above.

Referring briefly to FIG. 6A and FIG. 7A, a pillar 155 may be formed on the pixel defining layer 150 or at any other suitable location. The pillar 155 is formed between emission regions of adjacent unit pixel regions that emit the same-colored light. Also, a length 155L of the pillar 155 may be equal to or smaller than a distance Ed (FIG. 3A) between the emission regions of the adjacent unit pixel regions that emit the same-colored light. The pillar 155 may be formed of the same material as or a different material from the pixel defining layer 150. More specifically, the pillar 155 may be a photosensitive resin. Further, the pillar 155 may be formed of one selected from the group consisting of an acrylic-based organic material, a polyimide-based organic material, and a polyphenolic-based organic material.

The pillar 155 and the pixel defining layer 150 having the opening 150a may be formed at the same time using a half-tone mask. More specifically, a single or double insulating layer for forming the pixel defining layer 150 and the pillar 155 is stacked on the pixel electrode 140. By using the half-tone mask, while the opening 150a is being formed in the pixel defining layer 150, the pillar 155 is formed at the same time.

Thereafter, a first charge injection/transport layer 143 may be formed on the substrate 100 having the pillar 155. The first charge injection/transport layer 143 may be a single layer or a multilayer charge injection/transport layer. When the pixel electrode 140 is an anode, the first charge injection/transport layer 143 is a hole injection/transport layer. When the pixel electrode 140 is a cathode, the first charge injection/transport layer 143 is an electron injection/transport layer.

Thereafter, a fine metal mask 900 may be adhered to the substrate 100 such that it has a slit exposing the red unit pixel region R. In one embodiment, the fine metal mask 900 may be adhered to the first charge injection/transport layer 143 formed on the pillar 155. Alternatively, if the first charge injection/transport layer 143 is not formed, the fine metal mask 900 may be adhered to the pillar 155. That is, the fine metal mask 900 may be supported by the pillar 155. Since the pillar 155 is formed between the emission regions of the adjacent unit pixel regions that emit the same-colored light, the pillar 155 is exposed by the slit or covered by the fine metal mask 900 so that it is not in contact with an edge 900s of the slit. Accordingly, the edge 900s of the slit is located a predetermined distance from the first charge injection/transport layer 143 above the substrate 100. Alternatively, if the first charge injection/transport layer 143 is not formed, the edge 900s of the slit is located a predetermined distance above the pixel defining layer 150.

Subsequently, a red emission layer 145R may be formed on the substrate 100 using the fine metal mask 900 as a mask. The red emission layer 145R may be formed on the first charge injection/transport layer 143 in the red unit pixel region R. After that, the fine metal mask 900 may be removed from the substrate 100. As described above, because the edge 900s of the slit is located a predetermined distance above the first charge injection/transport layer 143 or the pixel defining layer 150 due to the pillar 155, cracks may not form in the first charge injection/transport layer 143 or the pixel defining layer 150 during the removal of the fine metal mask 900.

The pillar 155 may be formed to a height of 1 μm or more such that the edge 900s of the slit can be spaced a sufficient distance apart from the first charge injection/transport layer 143 or the pixel defining layer 150. However, when the pillar 155 has an excessive height, a shadow effect may take place. Accordingly, the pillar 155 may be formed to a height of about 1 μm to about 5 μm. Also, the pillar 155 may have a width 155w smaller than a width Pw of the red unit pixel region R. More preferably, the width 155w of the pillar 155 is equal to or smaller than a width Ew of the emission region E. Hence, close adhesion of the edge 900s of the slit to the pillar 155 or the first charge injection/transport layer 143 formed on the pillar 155 can be effectively prevented.

Referring to FIG. 3B, FIG. 4B, FIG. 5B, FIG. 6B, and FIG. 7B, a green emission layer 145G and a blue emission layer 145B are formed in the green and blue unit pixel regions, respectively, in the same manner as when the red emission layer 145R is formed. As described above, the pillar 155 prevents edges of slits of fine metal masks used to form the green and blue emission layers 145G and 145B from being adhered to the first charge injection/transport layer 143 formed on the pixel defining layer 150 or the pixel defining layer 150. Thus, when the fine metal masks are removed, (a crack) or cracks may not form in the first charge injection/transport layer 143 formed on the pixel defining layer 150 or in the pixel defining layer 150.

A second charge injection/transport layer 147 may be formed on the red, green, and blue emission layers 145R, 145G, and 145B. The second charge injection/transport layer 147 may be formed using a spin coating process or a blanket deposition process. The second charge injection/transport layer 147 may be a single layer or a multiple layer of a second charge injection layer and a second charge transport layer. When the pixel electrode 140 is an anode, the second charge injection/transport layer 147 is an electron injection/transport layer. When the pixel electrode 140 is a cathode, the second charge injection/transport layer 147 is a hole injection/transport layer.

An opposite electrode 149 is formed on the second charge injection/transport layer 147. When the pixel electrode 140 is an anode, the opposite electrode 149 is formed as a cathode, whereas when the pixel electrode 140 is a cathode, the opposite electrode 149 is formed as an anode. As stated above, the present invention may prevent formation of cracks in an organic layer adjacent to the emission region E (i.e., in the first charge injection/transport layer 143 formed on the pixel defining layer 150 or the pixel defining layer 150) that may be caused by removal of the fine metal mask 900. As a result, the cathode may be applied uniformly, without having portions thereof thinned or separated by a crack. The uniform application of the cathode suppresses and/or eliminates the pixel reduction phenomenon, and increases the amount of light emitted from an edge portion of the unit pixel region.

Figure 8B:
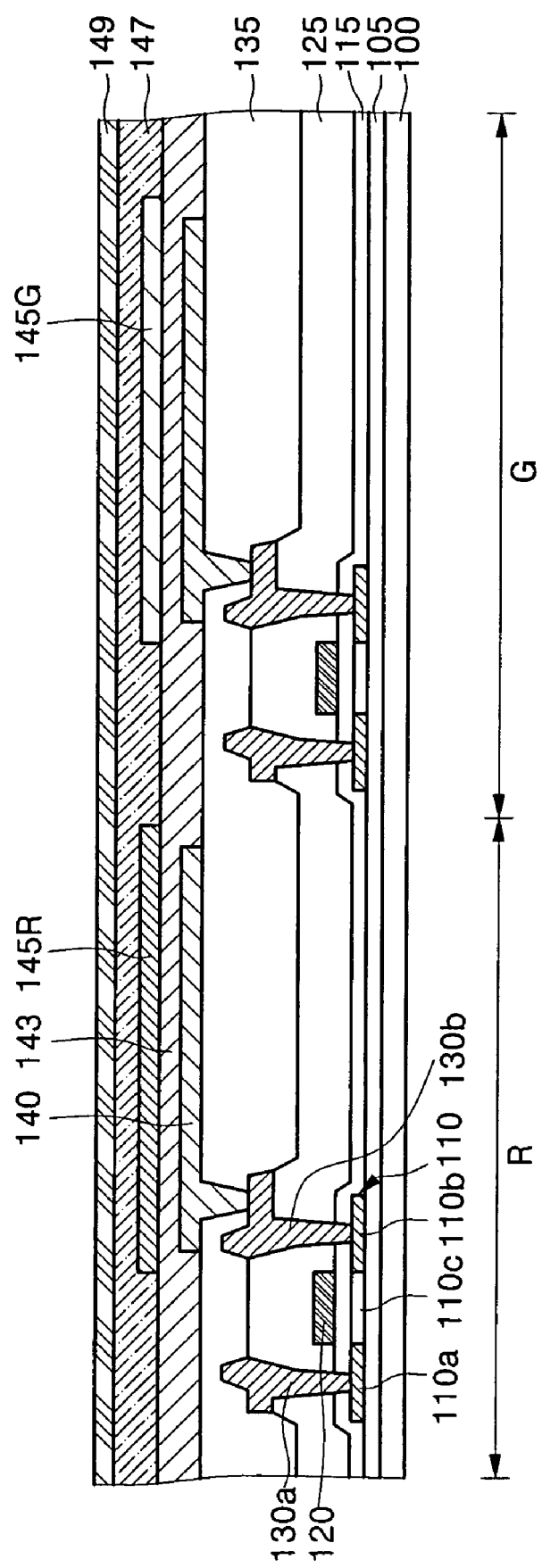
Figure 9B:
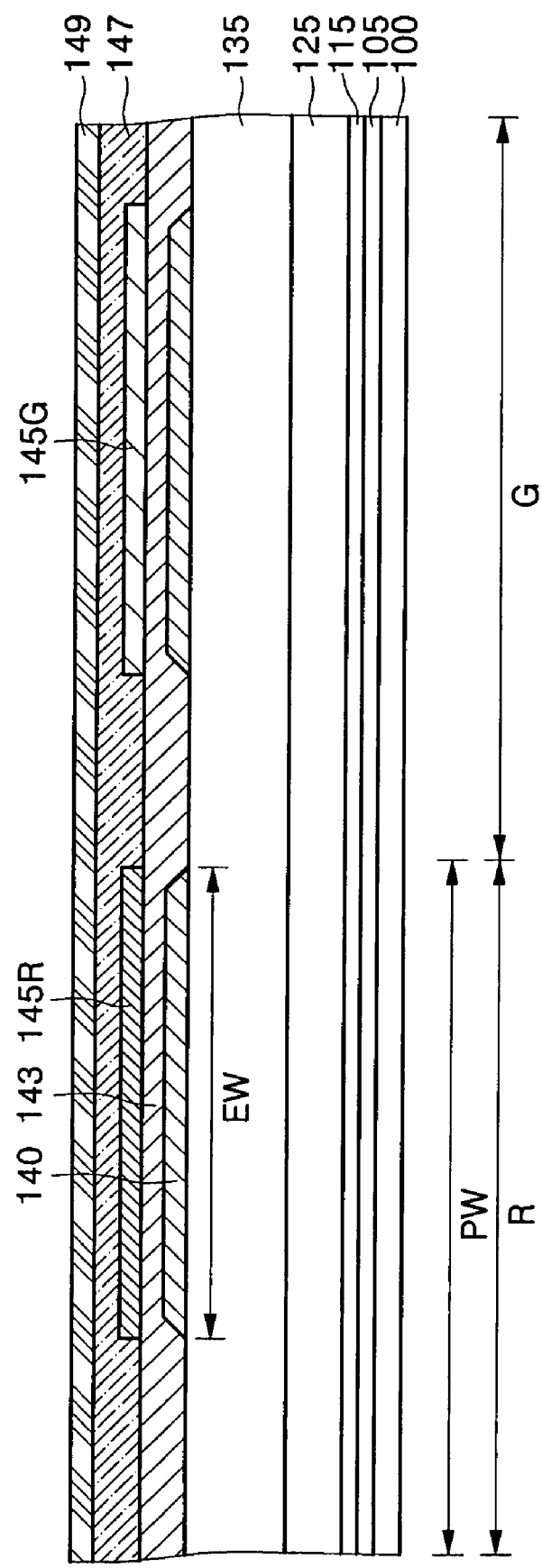
Figure 10A:
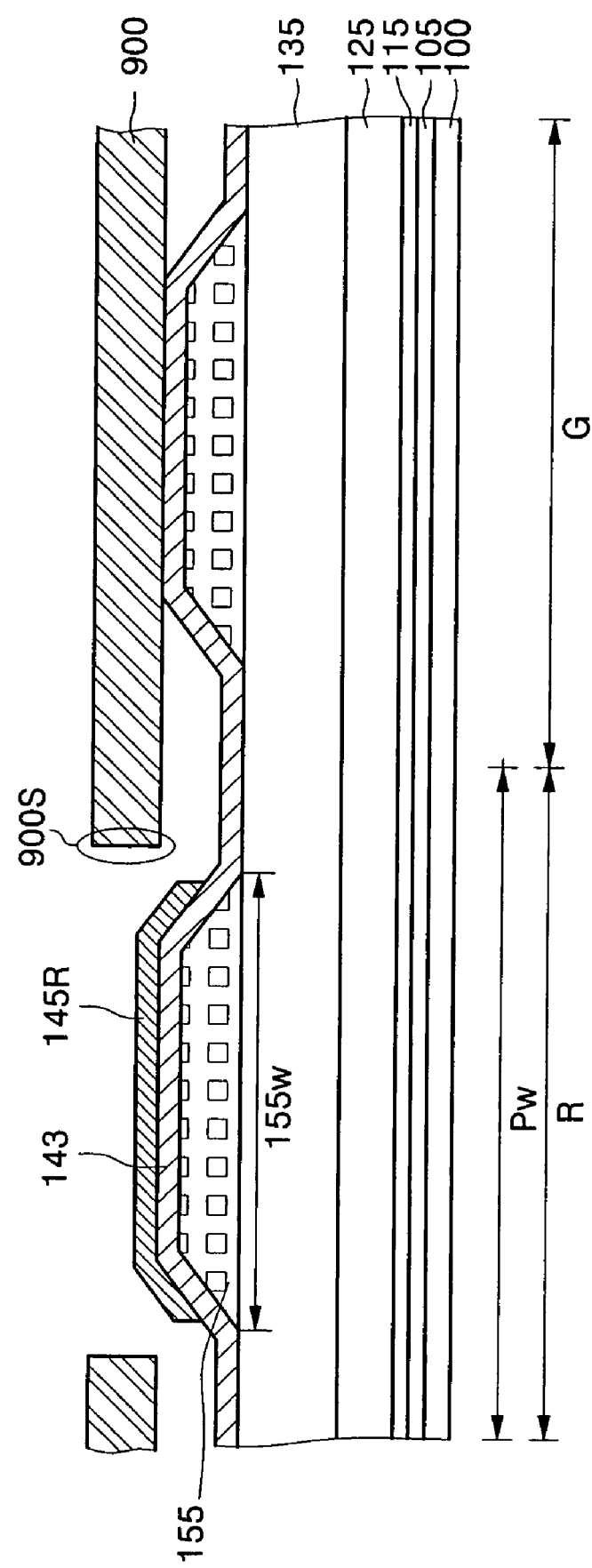
FIG. 10A and FIG. 10B are cross-sectional views taken along lines IV-IV of FIG. 3A and FIG. 3B, respectively, which further illustrate the second method of fabricating an OLED device of the present invention.
Figure 10B:
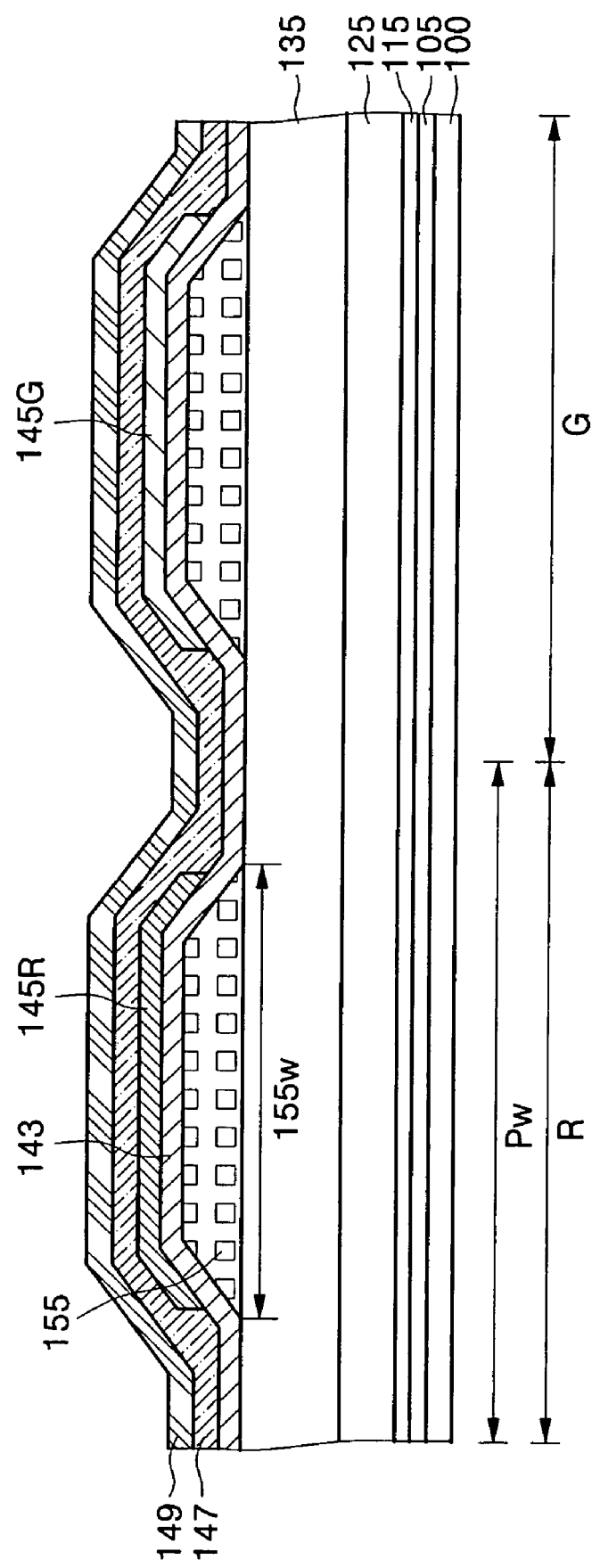
Figure 11A:
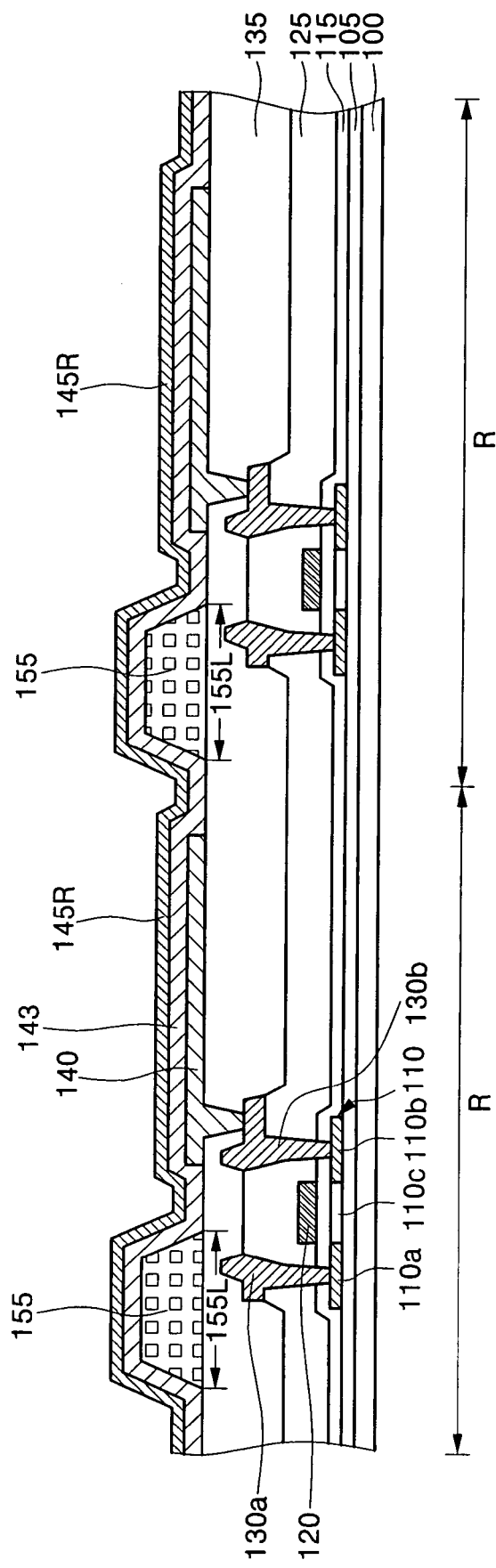
FIG. 11A and FIG. 11B are cross-sectional views taken along lines V-V of FIG. 3A and FIG. 3B, respectively, which further illustrate the second method of fabricating an OLED device of the present invention.
Figure 11B:
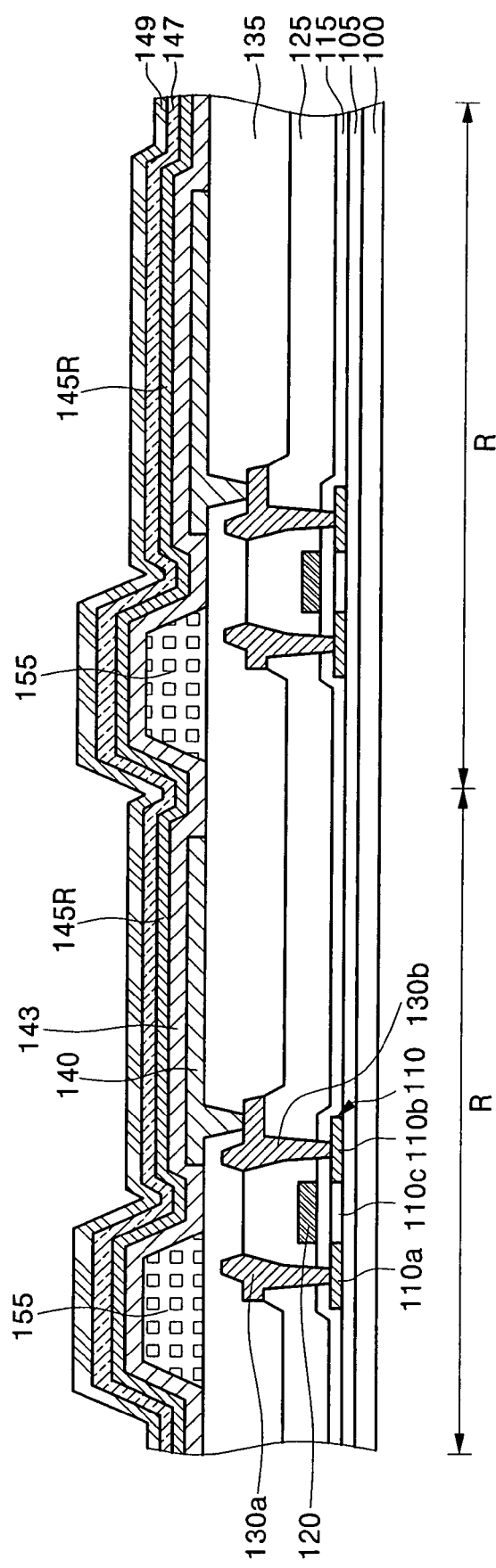

Hereinafter, a method of fabricating an OLED according to another embodiment of the present invention is described with reference to FIG. 3A, FIG. 3B, FIG. 8A, FIG. 8B, FIG. 9A, FIG. 9B, FIG. 10A, FIG. 10B, FIG. 11A, and FIG. 11B. Specifically, FIG. 8A and FIG. 8B are cross-sectional views taken along lines II-II of FIG. 3A and FIG. 3B, respectively. FIG. 9A and FIG. 9B are cross-sectional views taken along lines III-III of FIG. 3A and FIG. 3B, respectively. FIG. 10A and FIG. 10B are cross-sectional views taken along lines IV-IV of FIG. 3A and FIG. 3B, respectively. FIG. 11A and FIG. 11B are cross-sectional views taken along lines V-V of FIG. 3A and FIG. 3B, respectively.

Referring to FIG. 3A, FIG. 8A, FIG. 9A, FIG. 10A, and FIG. 11A, a substrate 100 on which red, green, and blue unit pixel regions R, G, and B are arranged is provided. The red, green, and blue unit pixel regions may be arranged in a stripe shape. That is, regions that emit same-colored light may be arranged in a column or row. Each of the unit pixel regions R, G, and B includes an emission region E and a non-emission region, which corresponds to a region excluding the emission region E.

The substrate 100 may be a glass substrate, a plastic substrate, or a quartz substrate. A buffer layer 105, a TFT, and an interlayer insulating layer 125 may be formed on the substrate 100 in the same manner TFT completed after 125 as described with reference to FIG. 4A, FIG. 5A, FIG. 6A, and FIG. 7A. The TFT may include a semiconductor layer 110, a gate insulating layer 115, a gate electrode 120, and source and drain electrodes 130a and 130b, and the semiconductor layer 110 includes source and drain regions 110a and 110b and a channel region 110c. As mentioned above, a capacitor (not shown) may be formed in the non-emission region during the formation of the TFT.

A passivation insulating layer 135 may be formed on the source and drain electrodes 130a and 130b. The passivation insulating layer 135 may be an organic layer, an inorganic layer, or a combination thereof. A pixel electrode 140 may be formed on the passivation insulating layer 135 to contact one of the source and drain electrodes 130a and 130b through a via hole. Unlike the embodiments described above, a region occupied by the pixel electrode 140 may correspond to the emission region E. That is, the emission region E may be defined by the pixel electrode 140. Meanwhile, a pixel driving circuit, which is electrically connected to the pixel electrode 140, may be disposed in the non-emission region. The pixel driving circuit may include the above-described TFT and capacitor.

The pixel electrode 140 may be formed as an anode or a cathode. When the pixel electrode 140 is formed as the anode, it may be made of ITO or IZO. Before the pixel electrode 140 as the anode is formed, a reflective layer may be formed on the passivation insulating layer 135 using one selected from the group consisting of Al, Ag, MoW, AlNd, and Ti. On the other hand, the pixel electrode 140 as the cathode may be made of Mg, Ca, Al, Ag, Ba, or an alloy thereof.

A pillar 155 may be formed on the substrate 100 on which the pixel electrode 140 is formed such that it protrudes upward further than the pixel electrode 140. The pillar 155 may be formed between emission regions of adjacent unit pixel regions that emit same-colored light. Also, the pillar 155 may have a length 155L equal to or smaller than a distance Ed between the emission regions of the adjacent unit pixel regions that emit the same-colored light. The pillar 155 may be a photosensitive resin. Further, the pillar 155 may be formed of one selected from the group consisting of an acrylic-based organic material, a polyimide-based organic material, and a polyphenolic-based organic material.

Thereafter, a first charge injection/transport layer 143 may be formed on the substrate 100 having the pillar 155. The first charge injection/transport layer 143 may be a single layer or a multilayer charge injection/transport layer. When the pixel electrode 140 is an anode, the first charge injection/transport layer 143 is a hole injection/transport layer. When the pixel electrode 140 is a cathode, the first charge injection/transport layer 143 is an electron injection/transport layer.

Thereafter, a fine metal mask 900 may be adhered to the substrate 100 such that a slit in the mask exposes the red unit pixel region R. In such an embodiment, the fine metal mask 900 may be adhered to the first charge injection/transport layer 143 formed on the pillar 155. If the first charge injection/transport layer 143 is not formed, the fine metal mask 900 may be adhered to the pillar 155. That is, the fine metal mask 900 may be supported by the pillar 155. Since the pillar 155 is formed between the emission regions of the adjacent unit pixel regions that emit the same-colored light, the pillar 155 is exposed by the slit or covered by the fine metal mask 900 so that it is not in contact with an edge 900s of the slit. Accordingly, the edge 900s of the slit is located a predetermined distance from the first charge injection/transport layer 143 above the substrate 100.

Subsequently, a red emission layer 145R may be formed on the substrate 100 using the fine metal mask 900 as a mask. The red emission layer 145R may be formed on the first charge injection/transport layer 143 in the red emission region R. After that, the fine metal mask 900 is removed from the substrate 100. As stated above, because the edge 900s of the slit is located a predetermined distance from the first charge injection/transport layer 143 due to the pillar 155, cracks may not form in the first charge injection/transport layer 143 during the removal of the fine metal mask 900.

The pillar 155 may be formed to a height of 1 µm or more such that the edge 900s of the slit can be spaced a sufficient distance apart from the first charge injection/transport layer 143. However, when the pillar 155 has an excessive height, a shadow effect may take place. Accordingly, the pillar 155 may be formed to a height of about 1 µm to about 5 µm. Also, the pillar 155 may have a width 155w smaller than a width Pw of the red unit pixel region R. More preferably, the width 155w of the pillar 155 is equal to or smaller than a width Ew of the emission region E. Hence, close adhesion of the edge 900s of the slit to the pillar 155 or the first charge injection/transport layer 143 formed on the pillar 155 can be effectively prevented.

Referring to FIG. 3B, FIG. 8B, FIG. 9B, FIG. 10B, and FIG. 11B, a green emission layer 145G and a blue emission layer 145B are formed in the green and blue unit pixel regions, respectively, in the same manner as when the red emission layer 145R is formed. As described above, the pillar 155 prevents edges of slits of fine metal masks used to form the green and blue emission layers 145G and 145B from adhering to the first charge injection/transport layer 143. Thus, when the fine metal masks are removed, cracks may not form in the first charge injection/transport layer 143.

A second charge injection/transport layer 147 may be formed on the red, green, and blue emission layers 145R, 145G, and 145B. The second charge injection/transport layer 147 may be formed using a spin coating process or a blanket deposition process. The second charge injection/transport layer 147 may be a single layer or multi-layer second charge injection/transport layer. When the pixel electrode 140 is an anode, the second charge injection/transport layer 147 is an electron injection/transport layer. When the pixel electrode 140 is a cathode, the second charge injection/transport layer 147 is a hole injection/transport layer.

An opposite electrode 149 is formed on the second charge injection/transport layer 147. When the pixel electrode 140 is an anode, the opposite electrode 149 is formed as a cathode, whereas when the pixel electrode 140 is a cathode, the opposite electrode 149 is formed as an anode. As stated above, the present invention may prevent formation of cracks in an organic layer adjacent to the emission region E (i.e., in the first charge injection/transport layer 13) that may be caused by removal of the fine metal mask 900. Consequently, the cathode may be uniformly deposited. Uniform application of the cathode suppresses and/or eliminates the pixel reduction phenomenon, and increases the amount of light emitted from an edge portion of the unit pixel region.

As explained thus above, the present invention may prevent formation of cracks in an organic layer adjacent to an emission region caused by removal of a fine metal mask, so that a cathode is not thinned or cut by the crack. Hence, an OLED device manufactured according to the principles of the invention can operate with improved viewing contrast and/or picture quality.

Although the present invention has been described with reference to certain embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display device, comprising:
   unit pixel regions arranged on a substrate, each of the unit pixel regions including an emission region and a non-emission region;
   a pixel electrode disposed at least in the emission region;
   a pillar disposed between emission regions of adjacent unit pixel regions that emit same-colored light, the pillar protruding upward further than the pixel electrode;
   an emission layer disposed on the pixel electrode; and
   an opposite electrode disposed on the emission layer,
   wherein only one pillar is disposed between only two adjacent emission regions, and
   wherein the pillar has a width smaller than a width of each of the unit pixel regions.

2. The device of claim 1, wherein the width of the pillar is equal to or smaller than a width of the emission region.

3. The device of claim 1, wherein the pillar has a length equal to or smaller than a distance between the emission regions of the adjacent unit pixel regions that emit same-colored light.

4. The device of claim 1, wherein the pillar has a height of about 1 μm or more.

5. The device of claim 4, wherein the height of the pillar is about 1 μm to about 5 μm.

6. The device of claim 1, wherein the pillar is formed of a material selected from the group consisting of an acrylic-based organic material, a polyimide-based organic material, and a polyphenolic-based organic material.

7. The device of claim 1, further comprising a pixel defining layer disposed on the pixel electrode and having an opening that exposes a portion of the pixel electrode,
   wherein the emission region is defined by the opening.

8. The device of claim 7, wherein the pillar is disposed on the pixel defining layer.

9. The device of claim 1, wherein the emission layer is formed using a fine metal mask.

10. The device of claim 1, wherein the unit pixel regions include red unit pixel regions, green unit pixel regions, and blue unit pixel regions.

11. The device of claim 1, wherein the unit pixel regions are arranged on the substrate in a stripe shape.

12. The device of claim 1, further comprising a pixel driving circuit disposed in the non-emission region and electrically connected to the pixel electrode.

13. The device of claim 12, wherein the pixel driving circuit includes a thin film transistor.

* * * * *